(12) United States Patent
Dosho et al.

(10) Patent No.: US 6,982,581 B2
(45) Date of Patent: Jan. 3, 2006

(54) DUTY CYCLE CORRECTION CIRCUIT (75) Inventors: Shiro Dosho, Osaka (JP); Naoshi Yanagisawa, Osaka (JP); Masaomi Toyama, Osaka (JP); Keijiro Umehara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/713,162

(22) Filed: Nov. 17, 2003

(65) Prior Publication Data
US 2004/0108878 A1    Jun. 10, 2004

(30) Foreign Application Priority Data
Dec. 6, 2002    (JP)    .............................. 2002-354732

(51) Int. Cl.
*H03K 3/017*    (2006.01)
(52) U.S. Cl. .......................... 327/175; 327/112; 326/29
(58) Field of Classification Search ........ 327/172–176, 327/108–112; 326/26–30, 82–92
See application file for complete search history.

(56) References Cited

U.S. PATENT DOCUMENTS

| | | | | |
|---|---|---|---|---|
| 4,518,873 A | * | 5/1985 | Suzuki et al. ................. | 326/86 |
| 4,894,560 A | * | 1/1990 | Chung ......................... | 327/134 |
| 5,369,316 A | * | 11/1994 | Chen et al. .................... | 326/83 |
| 5,488,317 A | * | 1/1996 | Webster et al. ................ | 326/45 |
| 5,552,719 A | * | 9/1996 | Murakami ..................... | 326/27 |
| 5,864,243 A | * | 1/1999 | Chen et al. .................... | 326/58 |
| 6,060,922 A | * | 5/2000 | Chow et al. .................. | 327/175 |

OTHER PUBLICATIONS

Razavi Behzad, "RF Microelectronics" Prentice Hall Communications Engineering and Emerging Technologies Series, 1998, pp. 290-293.

Wlllliam J. Daily et al., "Digital Systems Engineering" (USA) Cambridge University Press, pp. 581 (Aug. 1998).

* cited by examiner

*Primary Examiner*—Minh Nguyen
(74) *Attorney, Agent, or Firm*—McDermott Will & Emery LLP (57) ABSTRACT

In order to correct the duty cycle of a given clock signal to produce a clock signal with a 50% duty cycle, a duty cycle correction circuit includes a delay unit for delaying a first clock signal to output a second clock signal and a clock-signal output unit. The clock-signal output unit includes two transistors which use the first and second clock signals as the inputs of respective gates and an inverter circuit for inverting a signal output from a common drain of the transistors to output a third clock signal. The delay unit delays the first clock signal so that the first clock signal falling appears at a timing at which the duty cycle thereof becomes 50%. The two transistors in the clock-signal output unit output, as the third clock signal, a ground voltage and a source voltage as the signal from the common drain in response to the rising of the first clock signal and the falling of the second clock signal, respectively.

3 Claims, 9 Drawing Sheets

DUTY CYCLE CORRECTION CIRCUIT

BACKGROUND OF THE INVENTION

1. Field of the Invention

The present invention relates to circuits for processing a clock signal in a digital circuit. Specifically, the present invention relates to circuit techniques suitable for correction of the duty cycle of a clock signal produced by a frequency divider circuit or the like.

2. Description of the Related Art

For digital circuits, it is of great importance to keep a clock signal, which is used for synchronizing the operations of various units in the circuit, in a 50% duty cycle. Generally, a clock signal with a 50% duty cycle is produced by a frequency divider circuit.

Figure 7:
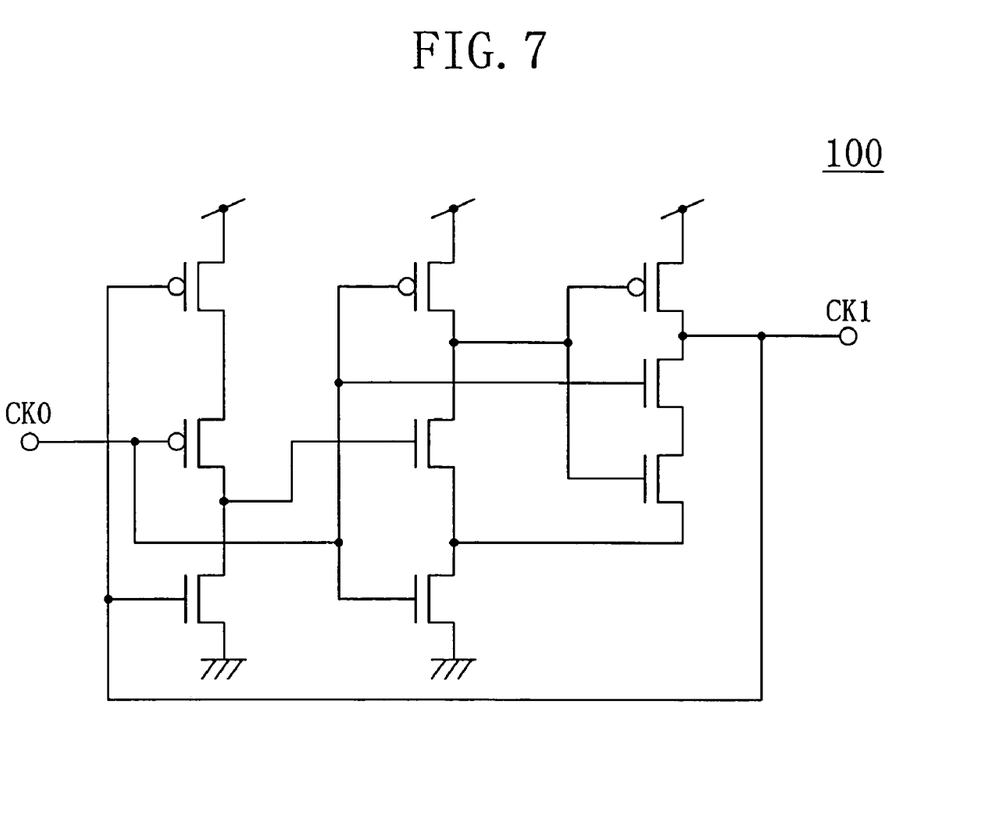
FIG. 7 is a circuit diagram of a typical frequency divider circuit.

FIG. 7 shows a typical circuit configuration of the frequency divider circuit (a divide-by-two frequency divider circuit). A frequency divider circuit 100 shown in FIG. 7 receives a clock signal CK0 and divides by two the frequency thereof to output a resulting clock signal CK1. By dividing by two the frequency of the clock signal CK0, both the periods of time for which the clock signal CK1 has the logic values "H" and "L" can be set at the period of time equivalent to one cycle of the clock signal CK0. Thereby this circuit provides the clock signal CK1 reaching a duty cycle of approximately 50% (See, for example, Document 1: William J. Dally, et al., "Digital Systems Engineering" (USA) Cambridge University Press, pp.581 (August 1998)).

In recent years, digital circuits have employed clock signals of very high frequency. With such trend, it becomes difficult to provide a clock signal with a 50% duty cycle because of the effect of signal propagation delay caused by transistors constituting the frequency divider circuit 100, especially the effect of delay caused by the MOS resistances. This difficulty will be described below.

Figure 8A:
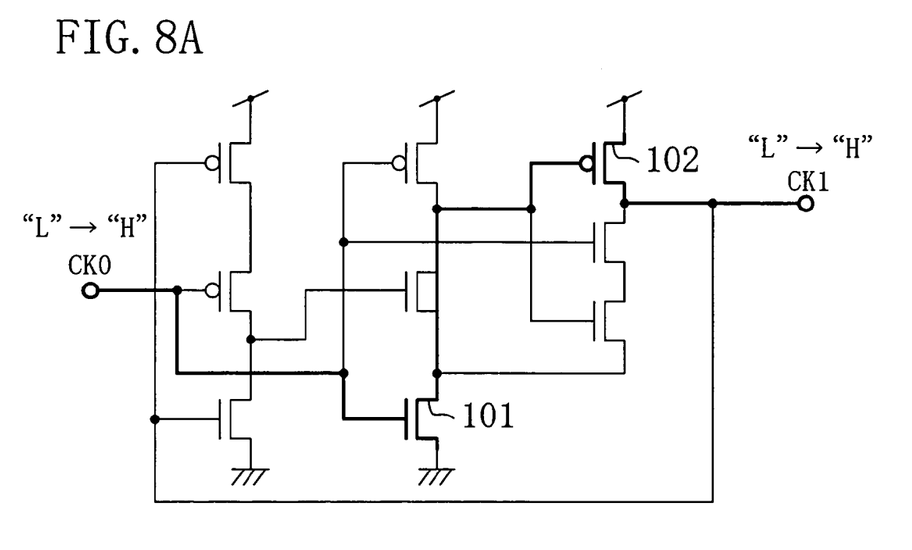
FIG. 8 is a block diagram illustrating how signals are propagated in the frequency divider circuit shown in FIG. 7.
Figure 8B:
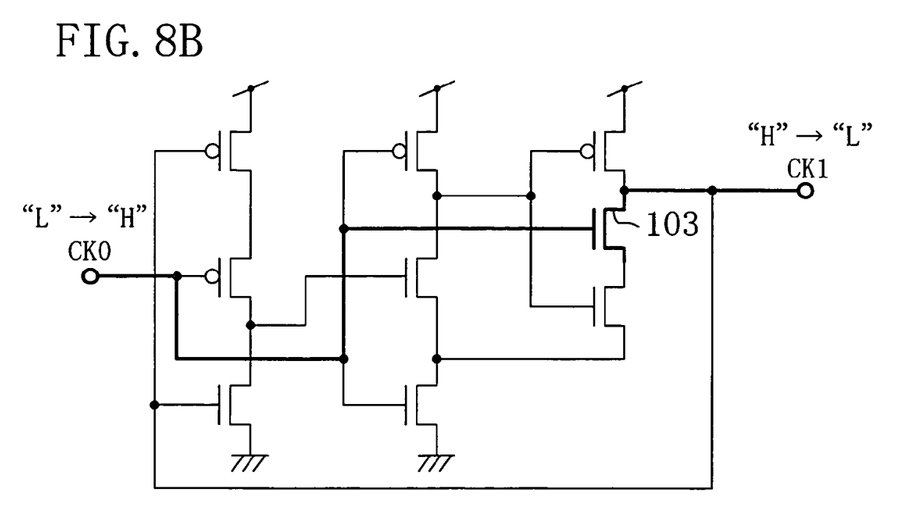

FIG. 8 illustrates how a signal is propagated in the case where the logic value of the clock signal CK1 output by the frequency divider circuit 100 changes. FIG. 8A illustrates how a signal is propagated where the clock signal CK1 rises ("L"→"H"). FIG. 8B illustrates how a signal is propagated where the clock signal CK1 falls ("H"→"L").

In a dynamic divide-by-two frequency divider circuit such as the frequency divider circuit 100, the logic value of the clock signal CK1 changes in response to the rising of the clock signal CK0. Signal propagation delay occurring when the clock signal CK1 rises results from the turn-ons of an n-channel transistor 101 and a p-channel transistor 102. On the other hand, signal propagation delay occurring when the clock signal CK1 falls results from the turn-on of an n-channel transistor 103. Consequently, the rising of the clock signal CK1 causes an extra delay by an amount equivalent to one p-channel transistor as compared to the falling of the clock signal CK1.

Figure 9:
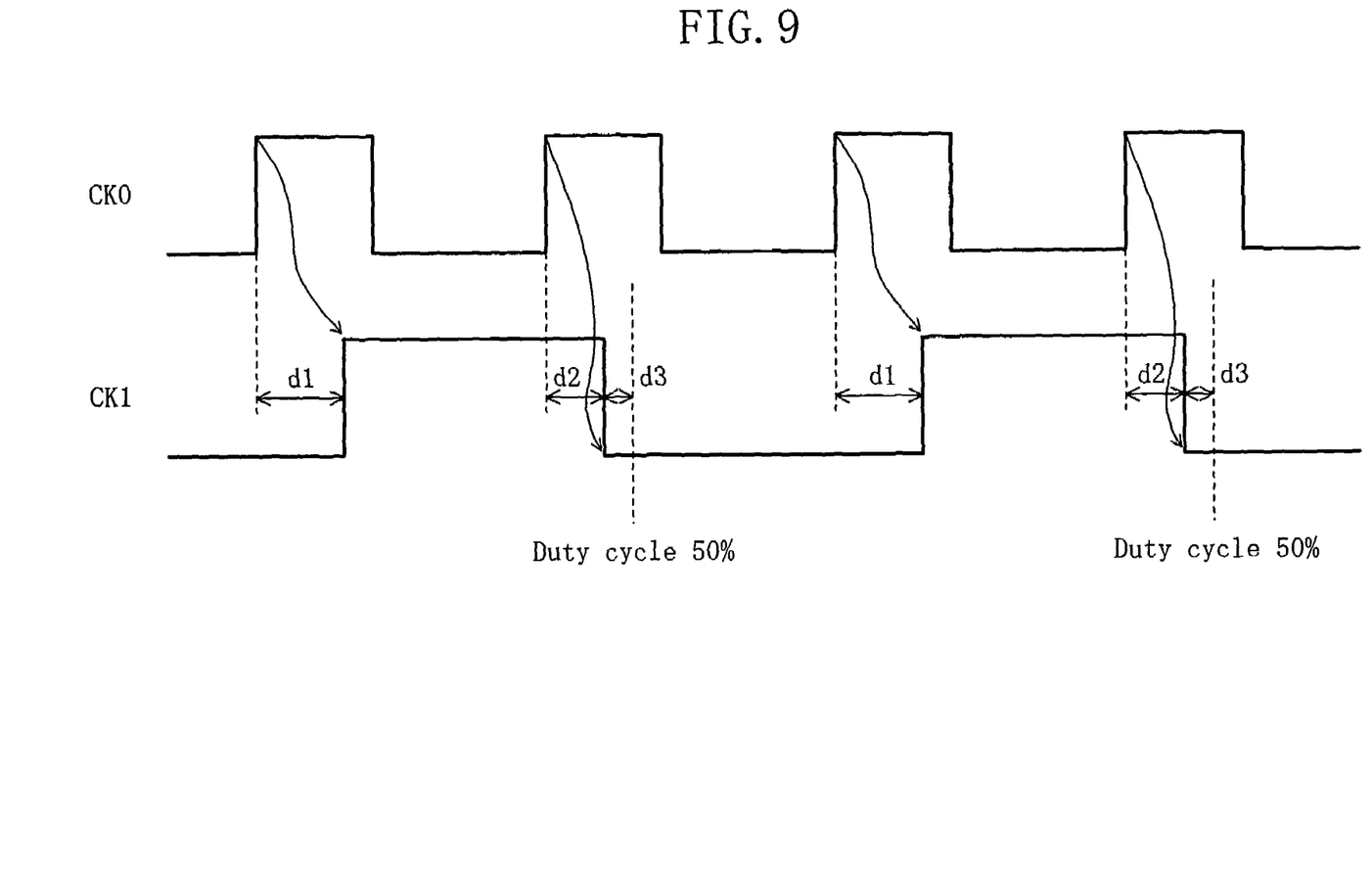
FIG. 9 is a waveform chart of input and output clock signals traveling in the frequency divider circuit shown in FIG. 7.

FIG. 9 shows waveforms of the clock signals CK0 and CK1 as an input and output of the frequency divider circuit 100, respectively. A delay d1 of the rising of the clock signal CK1 relative to the rising of the clock signal CK0 occurring in a regular cycle is greater than a delay d2 of the falling of the clock signal CK1, so that the duty cycle of the clock signal CK1 is deviated by an error d3 from the timing of a 50% duty cycle. If the clock signals CK0 and CK1 have relatively low frequencies, the error d3 can be neglected. However, as the frequencies thereof become higher, the error d3 cannot be neglected.

SUMMARY OF THE INVENTION

With the foregoing in mind, an object of the present invention is to provide a duty cycle correction circuit for correcting a received clock signal to reach a duty cycle of approximately 50%.

Means applied by the present invention comprises, as a duty cycle correction circuit, a delay unit for receiving a first clock signal in which a first logic value has a shorter period of time per cycle than a second logic value, delaying the first clock signal, and outputting a second clock signal which transitions to the second logic value at a timing at which the period of time equivalent to a half cycle has elapsed since the first clock signal transitioned to the first logic value; and a clock-signal output unit for outputting a third clock signal based on the first and second clock signals, and the duty cycle correction circuit receives the first clock signal and corrects the duty cycle of the received signal to output the third clock signal. In this means, the clock-signal output unit comprises: a first output unit for setting the third clock signal at a first logic output value with either one of the first logic value and the second logic value in response to the transition of the first clock signal to the first logic value; and a second output unit for setting the third clock signal at a second logic output value with the other of the first logic value and the second logic value in response to the transition of the second clock signal to the second logic value.

According to the present invention, the delay unit delays the first clock signal to output the second clock signal which transitions to the second logic value at a timing at which the period of time corresponding to a half cycle has elapsed since the first clock signal transitioned (rose or fell) to the first logic value, in other word, the timing at which the duty cycle of the first clock signal becomes approximately 50%. Then, the first output unit of the clock-signal output unit sets the third clock signal at the first logic output value in response to the transition of the first clock signal to the first logic value. On the other hand, the second output unit of the clock-signal output unit sets the third clock signal at the second logic output value in response to the transition of the second clock signal to the second logic value. As a result, the third clock signal transitions to the second logic output value at the timing at which the duty cycle of the first clock signal becomes approximately 50%. Consequently, the duty cycle correction circuit of the present invention can correct the duty cycle of the received first clock signal to provide the third clock signal with a duty cycle of approximately 50%.

To be more specific, in the duty cycle correction circuit of the present invention, the first clock signal is produced by a frequency divider circuit.

Specifically, the first output unit includes a first transistor which is of either one type of n-channel type and p-channel type and whose gate receives the first clock signal. Furthermore, the second output unit includes a second transistor which is of the other type of n-channel type and p-channel type, whose gate receives the second clock signal and whose drain is connected to a drain of the first transistor. Moreover, the third clock signal is based on a signal output from the common drain of the first and second transistors.

Specifically, the delay unit includes a transfer gate which is put into condition to pass a received signal and which receives the first clock signal to output the second clock signal.

Thus, the transfer gate put into condition to pass a received signal receives the first clock signal, which enables delay of the first clock signal. In this connection, the transfer gate preferably includes a transistor whose gate and drain are connected to each other.

Specifically, the delay unit includes a transistor whose gate is supplied with a predetermined voltage and of which either one of a source and a drain receives the first clock signal to output the second clock signal from the other of the drain and the source. The predetermined voltage supplied to the gate of the transistor is above a gate threshold value in the case where the transistor is an n-channel transistor while the predetermined voltage supplied to the gate of the transistor is below the gate threshold value in the case where the transistor is a p-channel transistor.

Thus, either the n-channel or p-channel transistor is provided in the delay circuit and the first clock signal is passed between the source and drain of the transistor. This enables delay of the first clock signal.

More preferably, the first clock signal is produced by a clock-signal production circuit formed of at least one n-channel transistor and at least one p-channel transistor, and the clock-signal output unit is formed of at least one n-channel transistor and at least one p-channel transistor. The transistor forming the delay unit has either one of the n- and p-channel types in respect of which type transistors included in the clock-signal production circuit and in the first output unit of the clock-signal output circuit and tuned on when the third clock signal transitions to the first logic output value are different in number from transistors included in the clock-signal production circuit and in the second output unit of the clock-signal output circuit and turned on when the third clock signal transitions to the second logic output value.

Thereby the numbers of n-channel and p-channel transistors can be equalized between transistors turned on where the third clock signal transitions to the first logic output value and transistors turned on when the third clock signal transitions to the second logic output value. Even if the characteristics of each transistor are changed by temperature variation or the like, the obtained third clock signal can be maintained at a duty cycle of approximately 50%.

DETAILED DESCRIPTION OF THE PREFERRED EMBODIMENTS

Hereinafter, embodiments of the present invention will be described with reference to the accompanying drawings.

(First Embodiment)

Figure 1:
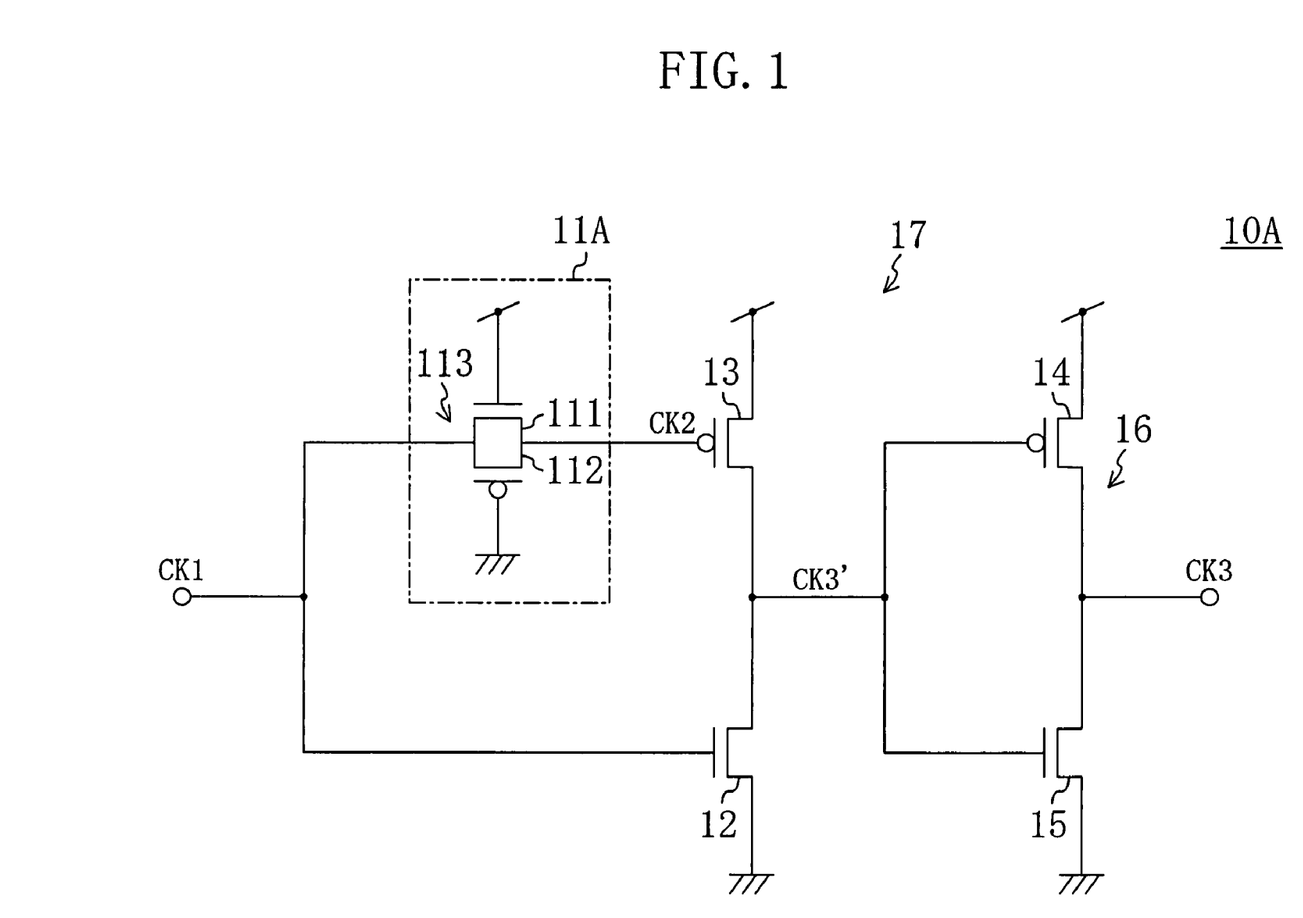
FIG. 1 is a circuit diagram of a duty cycle correction circuit according to a first embodiment of the present invention.

FIG. 1 shows a circuit configuration of a duty cycle correction circuit according to a first embodiment of the present invention. A duty cycle correction circuit 10A of this embodiment includes a delay unit 11A, an n-channel transistor 12, a p-channel transistor 13, and an inverter circuit 16. The delay unit 11A delays a clock signal CK1 (corresponding to a first clock signal) which is given to the duty cycle correction circuit 10A to output a clock signal CK2 corresponding to a second clock signal. The n-channel transistor 12 has a source supplied with a ground voltage and a gate supplied with the clock signal CK1. The p-channel transistor 13 has a source supplied with a source voltage and a gate supplied with the clock signal CK2. The inverter circuit 16 is composed of transistors 14 and 15 and inverses a signal CK3' output by a common drain of the transistors 12 and 13 to output a clock signal CK3 corresponding to a third clock signal. In addition, the transistors 12 to 15 constitute a clock-signal output unit 17. Note that a portion composed of the transistors 12 and 14 corresponds to a first output unit and a portion composed of the transistors 13 and 15 corresponds to a second output unit. The n-channel transistor 12 corresponds to a first transistor and the p-channel transistor 13 corresponds to a second transistor.

The delay unit 11A has a transfer gate 113 composed of an n-channel transistor 111 and a p-channel transistor 112. Gates of the transistors 111 and 112 are supplied with the source voltage and the ground voltage, respectively, so that the transfer gate 113 is set into condition to pass a received signal.

Figure 2:
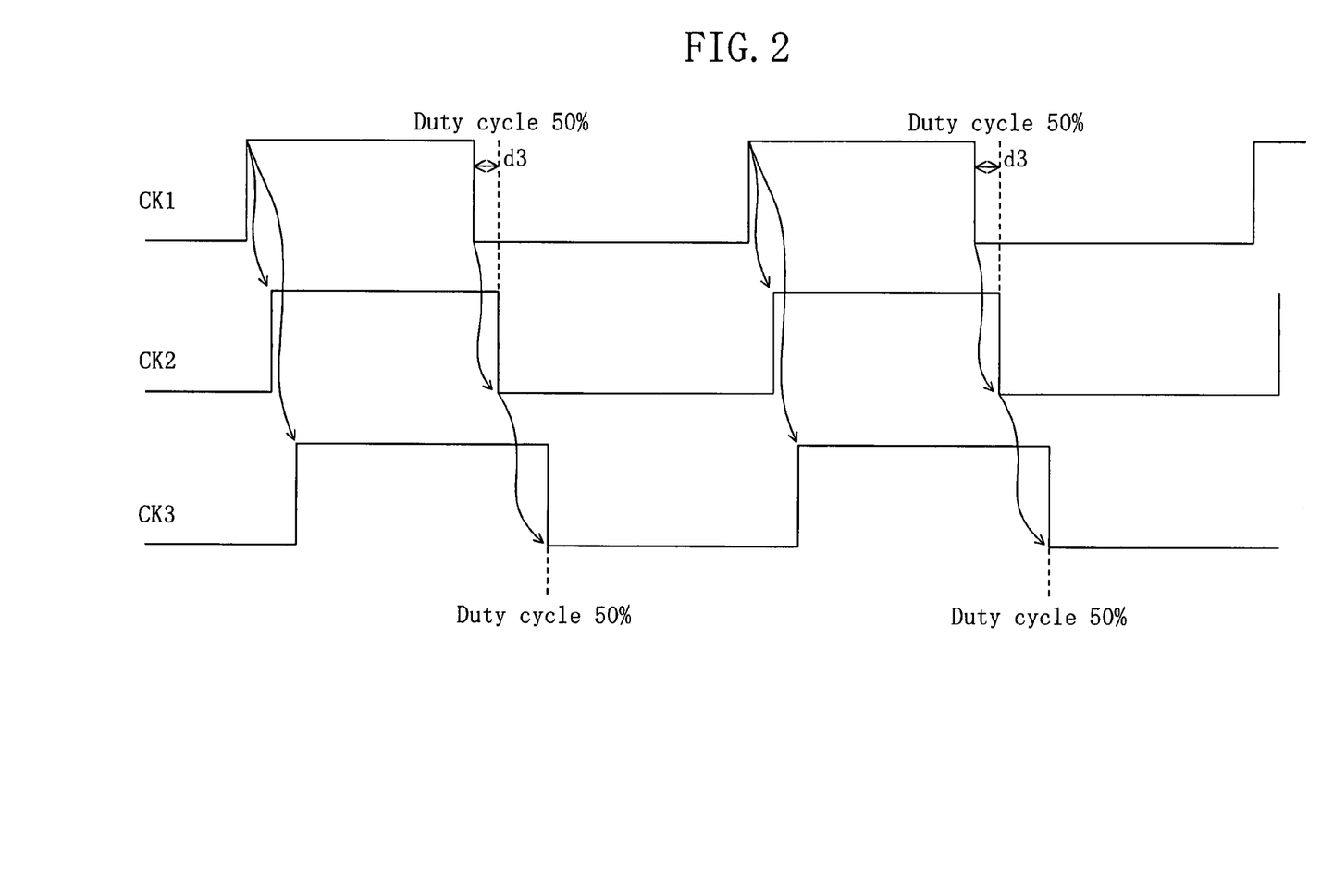
FIG. 2 is a timing chart of the duty cycle correction circuit shown in FIG. 1.

Next description will be made of an operation of the duty cycle correction circuit 10A thus constructed, with reference to the timing chart shown in FIG. 2. Herein, it is assumed that the duty cycle correction circuit 10A is provided at the latter stage of a frequency divider circuit 100 shown in FIG. 7 to receive the clock signal CK1, shown in FIG. 9, supplied by the frequency divider circuit 100.

When the clock signal CK1 transitions to a first logic value "H", the transistor 12 is turned on and then the signal CK3' transitions to a second logic value "L" (the ground voltage) (not shown). The inverter circuit 16 inverts the signal CK3' to output, from the transistor 14, a signal having a first logic output value "H" (the source voltage) as the clock signal CK3.

On the other hand, when the clock signal CK1 transitions to the second logic value "L", the clock signal CK2 transitions to the second logic value "L" with a delay (the delay d3 in FIG. 2) relative to the timing at which the clock signal CK1 transitions thereto. Thereby the transistor 13 is turned on and then the signal CK3' transitions to the first logic value "H" (the source voltage). The inverter circuit 16 inverts the signal CK3' (not shown) to output, from the transistor 15, a signal having a second logic output value "L" (the ground voltage) as the clock signal CK3.

The clock signal CK2 transition to the second logic value "L" appears at the timing at which the duty cycle of the clock signal CK1 is approximately 50%. Therefore, the duty cycle of the clock signal CK3 output by the duty cycle correction circuit 10A is approximately 50%.

In the above operation, just before the delay unit 11A receives the clock signal CK1 with the second logic value "L", that is, when the clock signal CK1 has the first logic value "H", the n-channel transistor 111 is in the turn-off state while the p-channel transistor 112 is in the turn-on state. Therefore, when the clock signal CK1 transitions to the second logic value "L", the influence on the delay of the clock signal CK1 is exerted relatively little by the n-channel transistor 111 but mainly by the ON resistance (the MOS resistance) of the p-channel transistor 112. Consequently, the delay unit 11A substantially creates a propagation delay equivalent to one p-channel transistor.

Figure 3A:
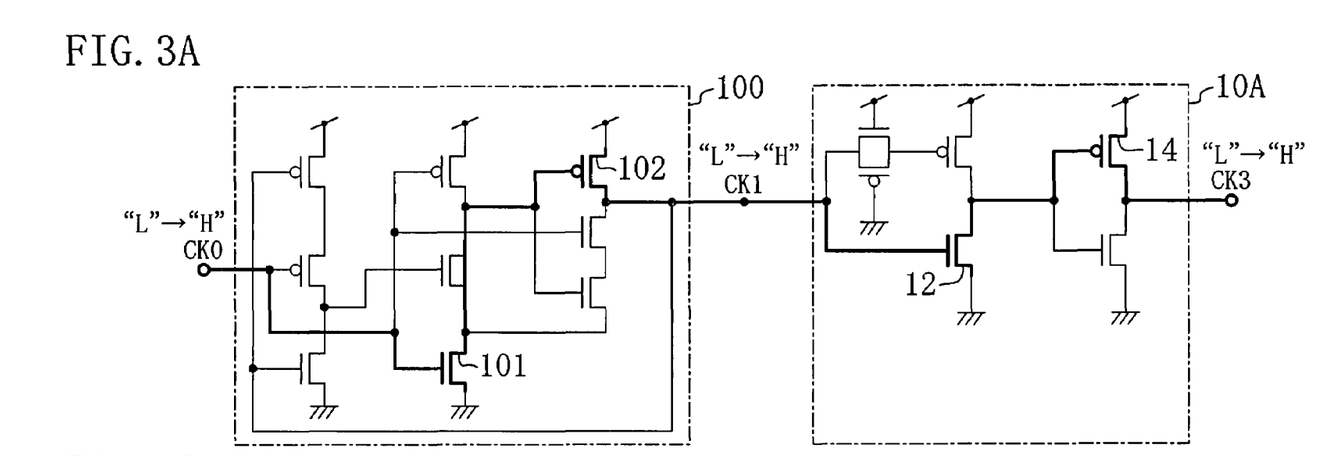
FIG. 3 is a block diagram illustrating how signals are propagated in the case where the duty cycle correction circuit shown in FIG. 1 is provided at the latter stage of a frequency divider circuit.
Figure 3B:
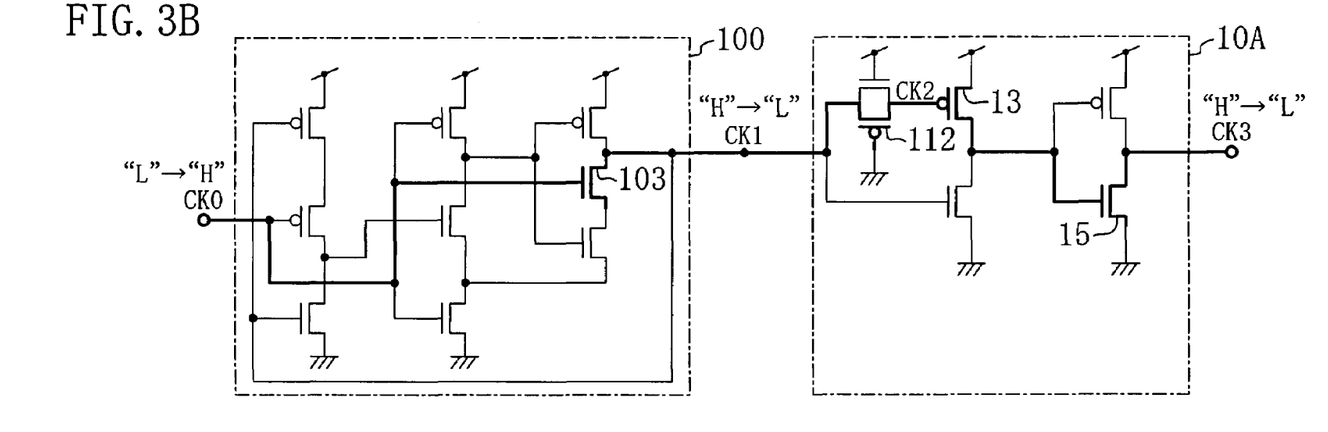

FIG. 3 illustrates how a signal is propagated where the logic value of the clock signal CK3 output by the duty cycle correction circuit 10A changes in the case where the duty cycle correction circuit 10A is provided at the latter stage of the frequency divider circuit 100 shown in FIG. 7. FIG. 3A illustrates how a signal is propagated where the clock signal CK3 rises ("L"→"H"). FIG. 3B illustrates how a signal is propagated where the clock signal CK3 falls ("H"→"L").

When the clock signal CK3 rises, propagation delay occurs because the signal for causing the rising travels through four transistors in total including the transistors 101 and 102 of the frequency divider circuit 100 and the transistors 12 and 14 of the duty cycle correction circuit 10A. On the other hand, when the clock signal CK3 falls, propagation delay occurs because the signal for causing the falling travels through four transistors in total including the transistor 103 of the frequency divider circuit 100 and the transistors 112, 13 and 15 of the duty cycle correction circuit 10A. That is to say, the duty cycle correction circuit 10A provided at the latter stage of the frequency divider circuit 100 equalizes propagation delays occurring in the rising and the falling of the clock signal CK3. From this, it is found that the duty cycle of the clock signal CK3 becomes approximately 50%.

Moreover, in the circuit configuration shown in FIG. 3, the numbers of n-channel and p-channel transistors through which the signal travels in the rising of the clock signal CK3 are each equal to those through which the signal travels in the falling of the clock signal CK3. This nearly equalizes the influences on the rising and falling of the clock signal CK3 even if the variation in temperature or the like changes the characteristics of the transistors forming the frequency divider circuit 100 and the duty cycle correction circuit 10A. Therefore, the resulting duty cycle of the third clock signal can be kept approximately 50%.

As discussed above, in the first embodiment, the propagation delay by the ON resistance of the p-channel transistor 112 in the delay unit 11A compensates "deviation" of the clock signal CK1 from a 50% duty cycle, thereby attaining the clock signal CK3 reaching a duty cycle of approximately 50%. Moreover, even if the variation in temperature or the like changes the characteristics of the transistors in the circuits, the resulting duty cycle of the clock signal CK3 can be kept approximately 50% with no influence exerted by the variation.

In the first embodiment, the circuit for producing the input to the duty cycle correction circuit 10A is the frequency divider circuit 100, but the production circuit is not limited to this in the present invention. The circuit for producing the clock signal CK1 as the input to the duty cycle correction circuit 10A may be a typical clock-signal production circuit for producing a clock signal.

In addition, "deviation" of the duty cycle equivalent to one p-channel transistor occurs in the clock signal CK1, but "deviation" equivalent to multiple transistors may occur. In this case, the delay unit 11A needs only to be formed so that the amount of propagation delay by the delay unit 11A increases.

In the first embodiment, the delay unit 11A is provided at the side of the p-channel transistor 13. Alternatively, it may be provided at the side of the n-channel transistor 12.

In addition, the inverter circuit 16 can be omitted. Even if it is omitted, the amounts of propagation delays occurring in the rising and the falling of the clock signal CK3 can be equalized. As a result, there is no difference of the effects by the present invention between the presence and absence of the inverter circuit 16.

In the foregoing discussion, the first and second logic values are "H" and "L", respectively. Even in the case where these values are reversed, a duty cycle correction circuit with the effect identical to the effect described above can be configured by changing the polarity of each transistor described above.

(Second Embodiment)

Figure 4:
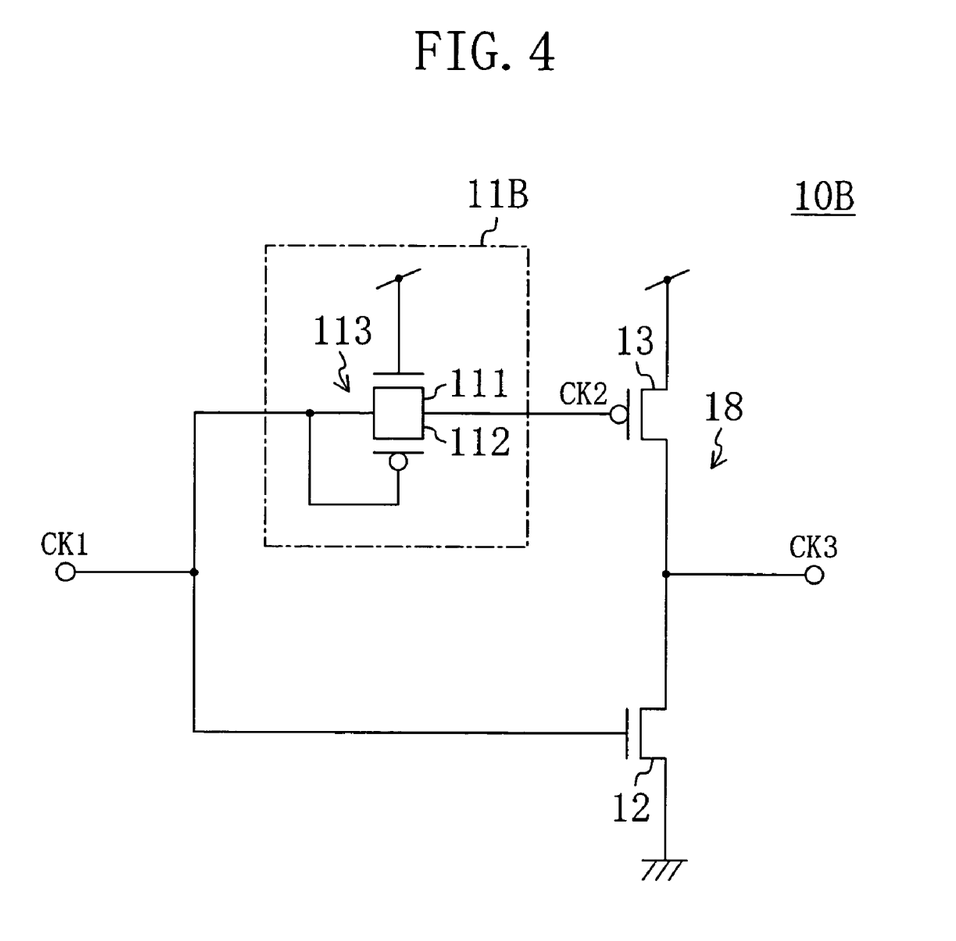
FIG. 4 is a circuit diagram of a duty cycle correction circuit according to a second embodiment of the present invention.

FIG. 4 shows a circuit configuration of a duty cycle correction circuit according to a second embodiment of the present invention. A duty cycle correction circuit 10B of this embodiment is configured by replacing the delay unit 11A of the duty cycle correction circuit 10A according to the first embodiment with a delay unit 11B having a different circuit configuration from the delay unit 11A. The duty cycle correction circuit 10B also includes a clock-signal output unit 18 with the same circuit configuration as the duty cycle correction circuit 10A but the absence of the inverter circuit 16. The clock-signal output unit 18 outputs the signal CK3' shown in FIG. 1 as the clock CK3. The description of the components shown in FIG. 4 that are the same as those shown in FIG. 1 will be omitted by retaining the same reference numerals. Hereinafter, only the delay unit 11B will be described.

The delay unit 11B has a transfer gate 113 composed of an n-channel transistor 111 and a p-channel transistor 112. A gate of the transistor 111 is supplied with the source voltage. On the other hand, a gate and a drain of the transistor 112 are connected to each other. This makes it possible to add propagation delay by the gate capacitance of the transistor 112 in delaying the clock signal CK1.

As discussed above, in the second embodiment, the propagation delay by the gate capacitance of the p-channel transistor 112 in addition to the ON resistance thereof can compensate "deviation" of the clock signal CK1 from a 50% duty cycle. This enables more accurate compensation for "deviation" of the clock signal CK1 equivalent to one p-channel transistor.

In the second embodiment, the gate and the drain of the n-channel transistor 111, instead of the p-channel transistor 112, may be connected to each other.

The delay unit 11B is provided at the side of the p-channel transistor 13. Alternatively, it may be provided at the side of the n-channel transistor 12.

(Third Embodiment)

Figure 5:
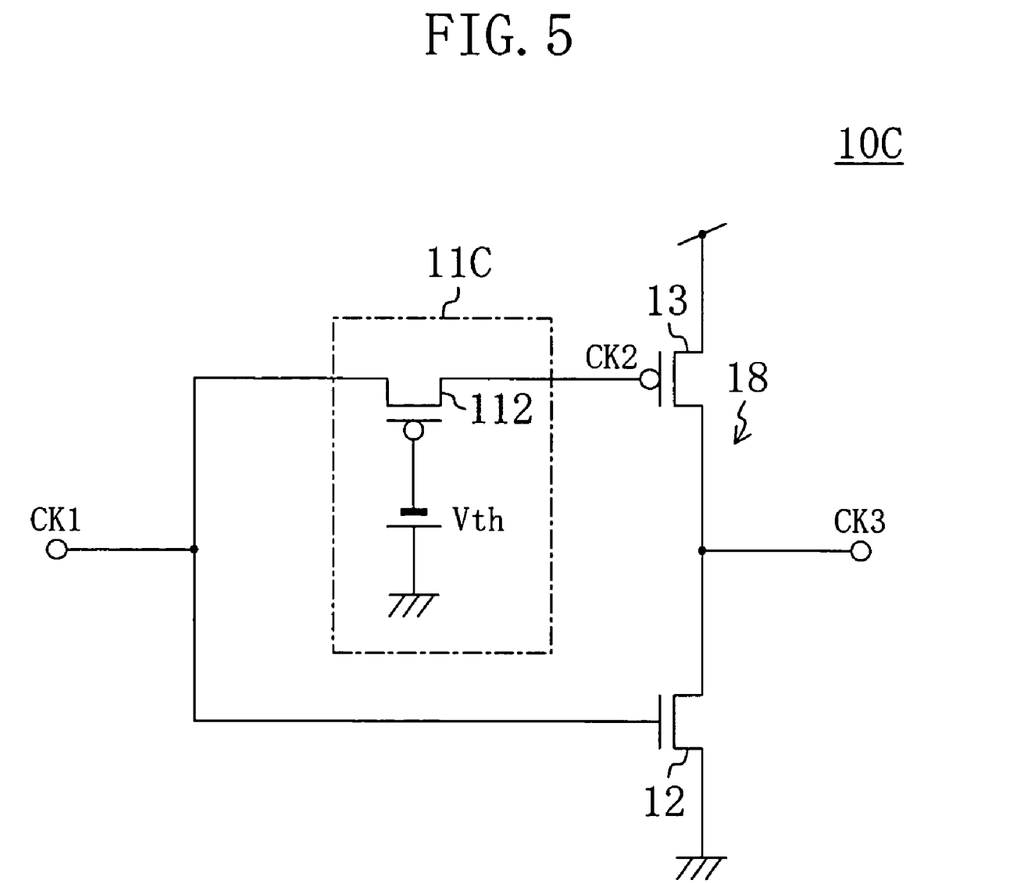
FIG. 5 is a circuit diagram of a duty cycle correction circuit according to a third embodiment of the present invention.

FIG. 5 shows a circuit configuration of a duty cycle correction circuit according to a third embodiment of the present invention. A duty cycle correction circuit 10C of this embodiment is configured by replacing the delay unit 11B of the duty cycle correction circuit 10B according to the second embodiment with a delay unit 11C having a different circuit configuration from the delay unit 11B. The description of the components shown in FIG. 5 that are the same as those shown in FIG. 4 will be omitted by retaining the same reference numerals. Hereinafter, only the delay unit 11C will be described.

The delay unit 11C has a p-channel transistor 112. A gate of the transistor 112 is supplied with a gate threshold voltage Vth of the transistor 112. Since the transistor 112 is of p-channel type, the voltage supplied thereto is lower than the ground voltage. Thus, by supplying the gate of the transistor 112 with the gate threshold voltage Vth, the switching operation of the transistor 112 according to the logic value of the clock signal CK1 supplied to the source or drain thereof can be performed with no transfer gate provided in the delay unit.

As discussed above, in the third embodiment, the propagation delay only by the p-channel transistor 112 can compensate "deviation" of the clock signal CK1 from a 50% duty cycle. This enables more accurate compensation for "deviation" of the clock signal CK1 equivalent to one p-channel transistor.

The voltage supplied to the gate of the transistor 112 may be greater than the gate threshold voltage Vth, in other words, lower than the voltage described above.

The delay unit 11C may include an n-channel transistor instead of the p-channel transistor 112. In this case, the gate of the n-channel transistor needs only to be supplied with a voltage equal to or more than a gate threshold voltage of this transistor.

The delay unit 11C may be provided at the side of the n-channel transistor 12.

(Fourth Embodiment)

The duty cycle correction circuits 10A to 10C according to the first to third embodiments basically have circuit configurations in which the delay units 11A, 11B and 11C are inserted into the inverter circuit (a single-input circuit) composed of the transistors 12 and 13, respectively. However, the present invention is not limited to these configurations and alternatively can be accomplished based on a multiple-input circuit. As an example of the multiple-input circuit, use is made of a NAND circuit with two inputs, and a duty cycle correction circuit configured based on this circuit will be described below.

Figure 6:
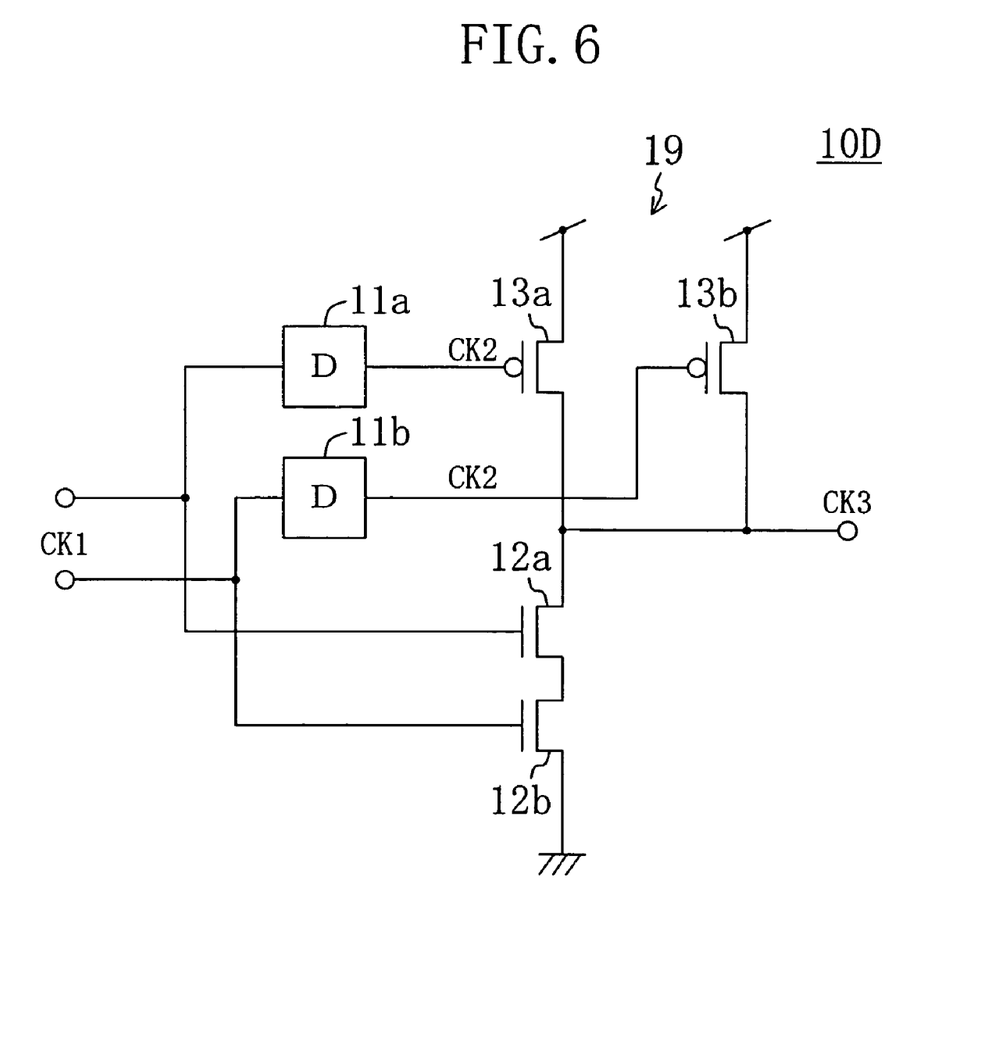
FIG. 6 is a circuit diagram of a duty cycle correction circuit according to a fourth embodiment of the present invention.

FIG. 6 shows a circuit configuration of a duty cycle correction circuit according to a fourth embodiment of the present invention. A duty cycle correction circuit 10D of this embodiment includes a two-input NAND circuit (a clock-signal output unit 19) composed of n-channel transistors 12a and 12b and p-channel transistors 13a and 13b. The duty cycle correction circuit 10D further includes delay units 11a and 11b provided at the sides of the p-channel transistors 13a and 13b, respectively. The two input terminals of the duty cycle correction circuit 10D receive a common clock signal CK1. Note that the delay units 11a and 11b may be any of the delay units 11A, 11B and 11C described in the first to third embodiments. In common with the duty cycle correction circuits 10A, 10B and 10C according to the first to third embodiments, the duty cycle correction circuit 10D configured above compensates "deviation" of the received clock signal CK1 from a 50% duty cycle to output the clock signal CK3 reaching a duty cycle of approximately 50%.

In the foregoing discussion, the delay units 11a and 11b are provided at the sides of the p-channel transistors 13a and 13b, respectively. Alternatively, these units may be provided at the sides of the n-channel transistors 12a and 12b, respectively.

As is apparent from the above discussion, the circuit of the present invention compensates "deviation", from a 50% duty cycle, of the clock signal produced by the frequency divider circuit or the like, thereby attaining a high-frequency clock signal with a 50% duty cycle that is conventionally difficult for only the frequency divider circuit to produce. In view of the circumstance under which clock signals of very high frequency have recently been used in digital circuits, the present invention has pronounced effects on those circuits.

What is claimed is:

1. A 50% duty cycle clock-signal production circuit comprising:
   a delay unit for receiving a first clock signal in which a first logic value has a shorter period of time per cycle than a second logic value, delaying the first clock signal and outputting a second clock signal which transitions to the second logic value at a timing at which the period of time equivalent to a half cycle has elapsed since the first clock signal transitioned to the first logic value;
   a clock-signal output unit for outputting a third clock signal based on the first and second clock signals; and
   a frequency divider circuit for producing the first clock signal,
   wherein the clock-signal output unit comprises:
   a first output unit for setting the third clock signal at a first logic output value with either one of the first logic value and the second logic value in response to the transition of the first clock signal to the first logic value; and
   a second output unit for setting the third clock signal at a second logic output value with the other of the first logic value and the second logic value in response to the transition of the second clock signal to the second logic value;
   wherein the delay unit includes a transistor whose gate is supplied with a predetermined voltage and of which either one of a source and a drain receives the first clock signal to output the second clock signal from the other of the drain and the source,
   the predetermined voltage supplied to the gate of the transistor is above a gate threshold value in the case where the transistor is an n-channel transistor while the predetermined voltage supplied to the gate of the transistor is below the gate threshold value in the case where the transistor is a p-channel transistor,
   the frequency divider circuit is formed of at least one n-channel transistor and at least one p-channel transistor,
   the clock-signal output unit is formed of at least one n-channel transistor and at least one p-channel transistor, and
   the numbers of n-channel and p-channel transistors through which a signal travels in the rising of the third clock signal are equal to those through which a signal travels in the falling of the third clock signal.

2. A duty cycle correction circuit comprising:
   a delay unit for receiving a first clock signal in which a first logic value has a shorter period of time per cycle than a second logic value, delaying the first clock signal, and outputting a second clock signal which transitions to the second logic value at a timing at which the period of time equivalent to a half cycle has elapsed since the first clock signal transitioned to the first logic value; and a clock-signal output unit for outputting a third clock signal based on the first and second clock signals, wherein the clock-signal output unit comprises: a first output unit for setting the third clock signal at a first logic output value with either one of the first logic value and the second logic value in response to the transition of the first clock signal to the first logic value; and a second output unit for setting the third clock signal at a second logic output value with the other of the first logic value and the second logic value in response to the transition of the second clock signal to the second logic value, the delay unit includes a transfer gate which is put into condition to pass the first clock signal to output the second clock signal, the transfer gate includes a transistor whose gate and drain are connected to each other, and the duty cycle correction circuit receives the first clock signal and corrects the duty cycle of the first clock signal to output the third clock signal.

3. The circuit of claim 2, wherein the first clock signal is produced by a frequency divider circuit formed of at least one n-channel transistor and at least one p-channel transistor, the clock-signal output unit is formed of at least one n-channel transistor and at least one p-channel transistor, and the numbers of n-channel and p-channel transistors through which a signal travels in the rising of the third clock signal are equal to those through which a signal travels in the falling of the third clock signal.

* * * * *